United States Patent
Amada et al.

(10) Patent No.: US 8,039,276 B2
(45) Date of Patent: Oct. 18, 2011

(54) MANUFACTURING METHOD OF SEMICONDUCTOR DEVICE

(75) Inventors: Haruo Amada, Tokyo (JP); Kenji Shimazawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 43 days.

(21) Appl. No.: 12/719,067

(22) Filed: Mar. 8, 2010

(65) Prior Publication Data
US 2010/0267175 A1 Oct. 21, 2010

(30) Foreign Application Priority Data

Apr. 20, 2009 (JP) .................................. 2009-101679

(51) Int. Cl.
*H01L 21/30* (2006.01)
(52) U.S. Cl. .......... 438/17; 438/457; 438/458; 438/459; 438/464; 257/E21.599
(58) Field of Classification Search .................... 438/17, 438/268, 457, 458, 459, 460, 464; 257/E21.599
See application file for complete search history.

(56) References Cited

U.S. PATENT DOCUMENTS

| | | | | |
|---|---|---|---|---|
| 6,162,702 A | * | 12/2000 | Morcom et al. | ............... 438/459 |
| 6,884,717 B1 | * | 4/2005 | Desalvo et al. | ............... 438/667 |
| 7,148,125 B2 | | 12/2006 | Suzuki et al. | |
| 7,335,574 B2 | * | 2/2008 | Okuda et al. | ................... 438/459 |
| 2003/0119281 A1 | * | 6/2003 | Suzuki et al. | ................. 438/460 |
| 2005/0253235 A1 | | 11/2005 | Hara | |

FOREIGN PATENT DOCUMENTS

| | | |
|---|---|---|
| JP | 2001-44088 A | 2/2001 |
| JP | 2003-243356 A | 8/2003 |
| JP | 2004186522 * | 7/2004 |
| JP | 2005-322839 A | 11/2005 |
| JP | 2007-317950 A | 12/2007 |
| JP | 2007-335659 A | 12/2007 |
| JP | 2008-53595 A | 3/2008 |

* cited by examiner

*Primary Examiner* — Michael Trinh
(74) *Attorney, Agent, or Firm* — Mattingly & Malur, PC

(57) ABSTRACT

The semiconductor device si formed by forming a first metal film over a first main surface of a semiconductor wafer having a first thinkness, performing back grinding to a second main surface of the semiconductor wafer thereby making a second thickness thinner than the first thickness and forming an insulation film pattern having a first insulation film and containing an annular insulation film pattern along the periphery of a second main surface of the semiconductor wafer over the second main surface along the periphery thereof. The second main surface of the semiconductor wafer is bonded to a pressure sensitive adhesive sheet thereby holding the device semiconductor wafer by way of the pressure sensitive adhesive sheet to a dicing frame in a state where the insulation film pattern is present.

20 Claims, 12 Drawing Sheets

MANUFACTURING METHOD OF SEMICONDUCTOR DEVICE

CLAIM OF PRIORITY

The present application claims priority from Japanese patent application JP 2009-101679 filed on Apr. 20, 2009, the content of which is hereby incorporated by reference into this application.

FIELD OF THE INVENTION

The present invention concerns a technique which is applied effectively to a wafer handling technique in a manufacturing method of a semiconductor device (or a semiconductor integrated circuit device).

BACKGROUND OF THE INVENTION

Patent Document 1 describes a technique of appending a seal member to the periphery of a wafer thereby leaving a thick peripheral portion as it is for preventing cracking or bending of the wafer upon etching the wafer rear face for lowering the on resistance of a vertical type MOSFET (Metal Oxide Semiconductor Field Effect Transistor).

Patent Document 2 describes a technique for improving the strength and the durability of the wafer in a vertical power device by forming a rim-shaped hard mask with a silicon nitride film or the like at the periphery of a wafer rear face and conducting etching using the same as a mask, thereby leaving a thick peripheral portion as it is.

Patent Document 3 discloses a technique of leaving a thick periphery of a wafer in a ring shape as it is for ensuring the strength of the wafer upon reducing the film thickness of a silicon wafer in the process for producing a semiconductor device, and filling a silicon oxide film, a silicon nitride film, etc. in a lattice-shape at the rear face of the wafer previously and etching the silicon portion so as to leave them thereby reducing the thickness.

Patent Document 4 and Patent Document 5 disclose techniques of forming a patterned silicon oxide film, a silicon nitride film, etc. for relieving warping of a wafer.

Patent Document 6 and Patent Document 7 disclose a technique of using a silicon nitride film pattern as an etching mask and removing the silicon nitride film pattern after etching upon reducing the thickness of a wafer.

[Patent Document 1] Japanese Unexamined Patent Publication No. 2003-243356
[Patent Document 2] Japanese Unexamined Patent Publication No. 2001-44088
[Patent Document 3] Japanese Unexamined Patent Publication No. 2007-317950
[Patent Document 4] Japanese Unexamined Patent Publication No. 2005-322839
[Patent Document 5] US Unexamined Patent Publication No. 2005-0253235
[Patent Document 6] Japanese Unexamined Patent Publication No. 2007-335659
[Patent Document 7] Japanese Unexamined Patent Publication No. 2008-53595

SUMMARY OF THE INVENTION

In a semiconductor process of repeating various fabrications in a state of a thin film wafer with the thickness of the wafer of less than 200 μm which is typically represented by an IGBT (Insulated Gate Bipolar Transistor), a vertical power MOSFET, etc., it is standardized to conduct the processing in a state of bonding a reinforcing glass sheet to the device surface (main surface on the side of the surface) of a wafer in the steps after thickness reduction. However, according to the study made by the present inventors, it has been found that about 70% of the manufacturing cost concerns the reinforcing glass sheet.

The present invention has been accomplished for solving the problems.

The present invention intends to provide manufacturing a process of a semiconductor device at high reliability.

The foregoing and other objects and novel features of the invention will become apparent by reading the descriptions of the present specification and the appended drawings.

An outline for typical inventions among those disclosed in the present application is simply explained as described below.

That is, according to an invention of the present application, a stress relieving insulation film pattern is formed at the peripheral end on the rear face of a wafer where the processing to the device surface of the wafer (on the side of the surface) has been completed substantially and back grinding has been applied.

The effects obtained by typical inventions among those disclosed in the present application are briefly explained as described below.

That is, by forming a stress relieving insulation film pattern to the peripheral end on the rear face of a wafer where processing to the device surface (on the side of the surface) of the wafer has been completed substantially and back grinding has been applied, subsequent wafer processing can be conducted smoothly without using an expensive material such as a reinforcing glass sheet or the like.

DETAILED DESCRIPTION OF THE PREFERRED EMBODIMENT

[Summary of the preferred embodiment]

Figure 1:
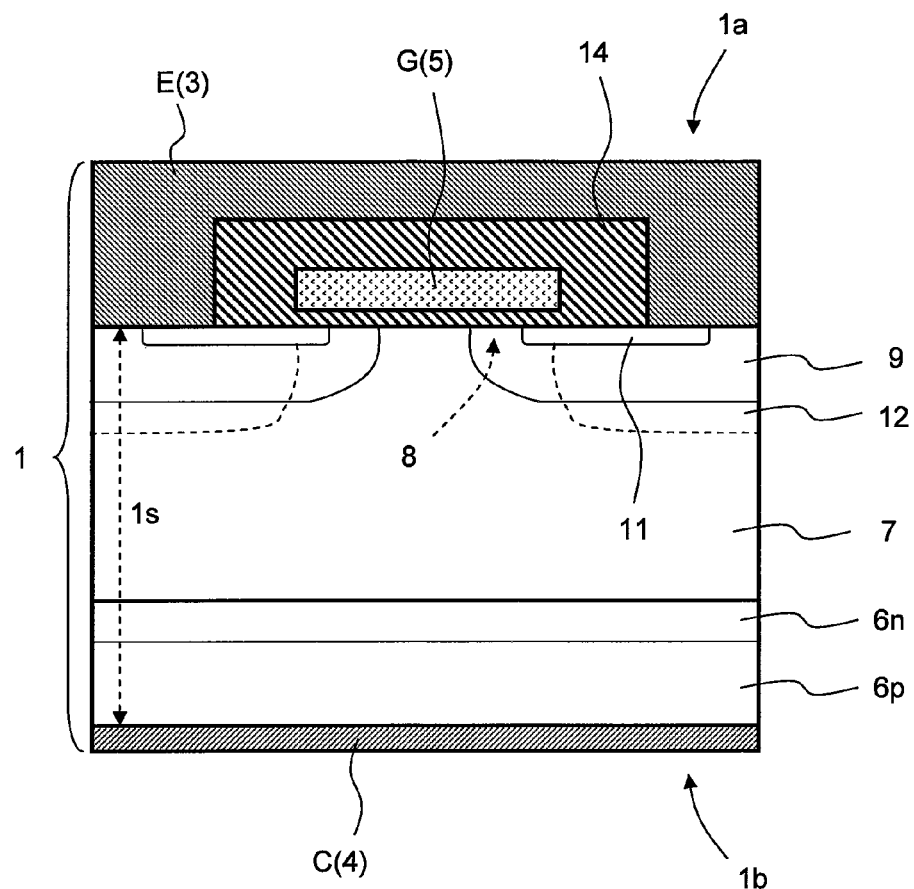
FIG. 1 is an enlarged cross-sectional view for a cell portion of a non-punch through type IGBT device which is an example of a device as a target of a manufacturing method of a semiconductor device in one embodiment of the present invention.

At first, an outline of a typical embodiment of the invention disclosed in the present application is to be described.

1. A manufacturing method of a semiconductor device includes the steps of:
(a) forming a first metal film over a first main surface of a semiconductor wafer having a first thickness;
(b) conducting, after the step (a), back grinding to a second main surface of the semiconductor wafer thereby making a second thickness thinner than the first thickness;
(c) forming, after the step (b), an insulation film pattern comprising a first insulation film and containing an annular insulation film pattern along the periphery of a second main surface of the semiconductor wafer over the second main surface along the periphery thereof;
(d) making the thickness for the opening of the annular insulation film pattern to a third thickness which is thinner than the second thickness in a state where the insulation film pattern is present;
(e) conducting, after the step (d), an electric test to the semiconductor wafer in a state where the insulation film pattern is present;
(f) bonding, after the step (e), the second main surface of the semiconductor wafer to a pressure sensitive adhesive sheet thereby holding the device by way of the pressure sensitive adhesive sheet to a dicing frame in a state where the insulation film pattern is present; and
(g) dividing, after the step (f), the semiconductor wafer into individual chips in a state where it is held to the dicing frame.

2. In a manufacturing method of the semiconductor device according to 1 above, the first insulation film has such a stress as relieving the stress exerted on the semiconductor wafer.

3. In a manufacturing method of the semiconductor device according to 1 or 2 described above, the first insulation film is formed by CVD.

4. In a manufacturing method of the semiconductor device according to 1 or 2 described above, the first insulation film is formed by plasma CVD.

5. In a manufacturing method of the semiconductor device according to 1 or 2 described above, the first insulation film is formed by sputtering.

6. In a manufacturing method of a semiconductor device according to any one of 1 to 5 described above, the insulation film pattern shows an annular shape along the outer periphery of the semiconductor wafer.

7. In a manufacturing method of a semiconductor device according to any one of 1 to 6 described above, the first insulation film is an inorganic insulation film.

8. In a manufacturing method of a semiconductor device according to any one of 1 to 7 described above, the first insulation film is a silicon nitride type insulation film.

9. In a manufacturing method of a semiconductor device according to any one of 1 to 8 described above, the first metal film is an aluminum type, copper type, or tungsten type metal film.

10. In a manufacturing method of a semiconductor device according to any one of 1 to 9 described above, the etching in the step (d) is wet etching.

11. In a manufacturing method of a semiconductor device according to any one of 1, 2 and 5 to 10 described above, the insulation film pattern is formed by sputtering using a shadow mask.

12. In a manufacturing method of a semiconductor device according to any one of 1 to 11 described above, the electric test in the step (e) is a wafer test.

13. In a manufacturing method of a semiconductor device according to any one of 1 to 12 described above, the semiconductor device has a power MOSFET.

14. In a manufacturing method of a semiconductor device according to any one of 1 to 12 described above, the semiconductor device has an IGBT.

15. In a manufacturing method of a semiconductor device according to any one of 1 to 14 described above, the semiconductor wafer is a silicon type wafer.

16. A manufacturing method of a semiconductor device according to any one of 1 to 15 described above, further includes a step of:
(h) before the step (e) and after the step (d), forming a second metal film over the second main surface of the semiconductor wafer in a state where the insulation film pattern is present.

17. A manufacturing method of a semiconductor device according to 16 described above, further includes a step of:
(i) before the step (h) and after the step (d), implanting impurity ions to the second main surface of the semiconductor wafer in a state where the insulation film pattern is present.

18. A manufacturing method of a semiconductor device according to 17 described above, further includes a step of:
(j) before the step (h) and after the step (i), conducting activation annealing for the impurity ions to the second main surface of the semiconductor wafer in a state where the insulation film pattern is present.

19. A manufacturing method of a semiconductor device according to 18 described above, further includes a step of:
(k) before the step (h) and after the step (j), removing an oxide film in the opening of the second main surface of the semiconductor wafer in a state where the insulation film pattern is present.

20. In a manufacturing method of a semiconductor device according to any one of 1 to 19 described above, the first thickness is 230 μm or more and less than 1 mm, the second thickness is 70 μm or more and less than 230 μm, and the third thickness is less than 200 μm and 30 μm or more.

[Explanation of the form of description, basic terms, and usage in the present application]

1. In the present application, descriptions of the embodiment are sometimes divided into a plurality of sections whenever circumstances require it for the sake of convenience. However, they are not independent and separated of one another unless otherwise specified but in a relation that they are respective portions of a single embodiment, one as details of portion of the other, or a modified example of portion or an entire portion, etc. Further, duplicate explanations for identical portions are to be omitted in principle. Further, each of the constituent elements in the embodiment is not indispensable unless otherwise specified, theoretically defined to a specific number thereof, and considered apparently not so in view of the context.

Further, in the present application, when there is reference to a "semiconductor device", this means a device comprising primarily various kinds of transistors (active elements), and resistors, capacitors, etc. integrated, for example, over a semiconductor chip, etc. (for example, a single crystal silicon substrate). Typical examples of the various kinds of transistors can include, for example, MISFET (Metal Insulator Semiconductor Field Effect Transistor) typically represented by MOSFET (Metal oxide Semiconductor Field Effect Transistor).

2. Also in the description of the embodiment, etc., when it is described as "X comprising A", etc. with respect to materials, compositions, etc., this does not exclude a case having an element other than A as one of main constituent elements unless otherwise specified, or it is considered apparently not so in view of the context. For example, referring to an ingredient, this means that "X comprising A as a main ingredient", etc. For example, when it is described as a "silicon material" or the like, this is not limited to pure silicon but, needless to say, also includes a member containing an SiGe alloy or other polynary alloys comprising silicon as the main ingredient, and other additives. Also when it is described as "silicon oxide film", "silicon oxide type insulation film", or the like, it is needless to say that this obviously includes not only a relatively pure undoped silicon oxide but also thermal oxide films such as FSG (Fluorosilicate Glass), TEOS-based silicon oxides, SiOC (Silicon Oxicarbide), carbon doped silicon oxides, or OSG (Organosilicate Glass), PSG (Phosphorus Silicate Glass), BPSG (Borophosphosilicate Glass), CVD oxide films, coating type silicon oxides such as SOG (Spin On Glass), or nano-clustering silica (NSC), and silica type Low-k insulation films (porous type insulation film) formed by introducing voids to materials similar therewith, as well as composite films with other silicon type insulator films comprising them as main constituent elements.

Further, silicon type insulation films which are customarily used along with the silicon oxide type insulation films in the field of semiconductors include silicon nitride type insulation films. Materials belonging to the group include SiN, SiCN, SiNH, SiCNH, or the like. When described as "silicon nitride", this includes both SiN and SiNH unless otherwise specified. In the same manner, when there is reference to "SiCN", this includes both SiCN and SiCNH unless otherwise specified.

While SiC has a nature similar to that of SiN, SiON should rather be classified as a silicon oxide type insulation film in most cases.

The silicon nitride film is used frequently as an etching stop film in the SAC (Self-Aligned Contact) technique, as well as used also as a stress providing film in SMT (Stress Memorization Technique).

3. In the same manner, while preferred examples are shown with respect to shape, position, and attribute, it is needless to say that they are not limited strictly thereto unless otherwise specified or considered apparently not so in view of the context.

4. Also, when a particular numerical value or amount is referred to, this may be a numerical value greater than the particular value or a numerical values less than the particular numerical value unless otherwise specified, theoretically limited to the numerical value, or considered not apparently so in view of the context.

5. When a "wafer" is described, this usually means a single crystal silicon wafer over which semiconductor devices (also semiconductor integrated circuit devices and electronic devices) are formed, but it is needless to say that the wafer also includes composite wafers comprising insulation substrates such as epitaxial wafers, SOI substrates, or LCD glass substrates and semiconductor layers, etc.

[Further Detailed Description of the Preferred Embodiments]

A preferred embodiment is to be described more specifically. In each of the drawings, identical or similar portions are indicated by identical or similar symbols or reference numerals for which duplicate explanations are not repeated in principle.

Further, in the accompanying drawings, hatching, etc. may sometimes be omitted even for cross sections in a case where they may complicate the drawings or where distinction from a plane is apparent. In connection therewith, even for a hole closed in view of a plane, a contour line at the background thereof may sometimes be omitted in a case if it is apparent in view of explanation therefor, etc. Further, hatching may sometimes be applied even to a not cross-sectioned portion in order to clearly indicate that the portion is not a plane.

Since details of bump electrodes and periphery thereof in bump electrode-mounted products are described specifically in Japanese Unexamined Patent Publication No. 2005-303218 made by the inventors of the present application, description for these portions is not repeated in principle in the present application.

1. Explanation for a non-punch through type igbt device, etc. as an example of a device which is an object of a manufacturing method of a semiconductor device according to an embodiment of the present invention (mainly, with reference to FIG. 1 and FIG. 2)

Figure 2:
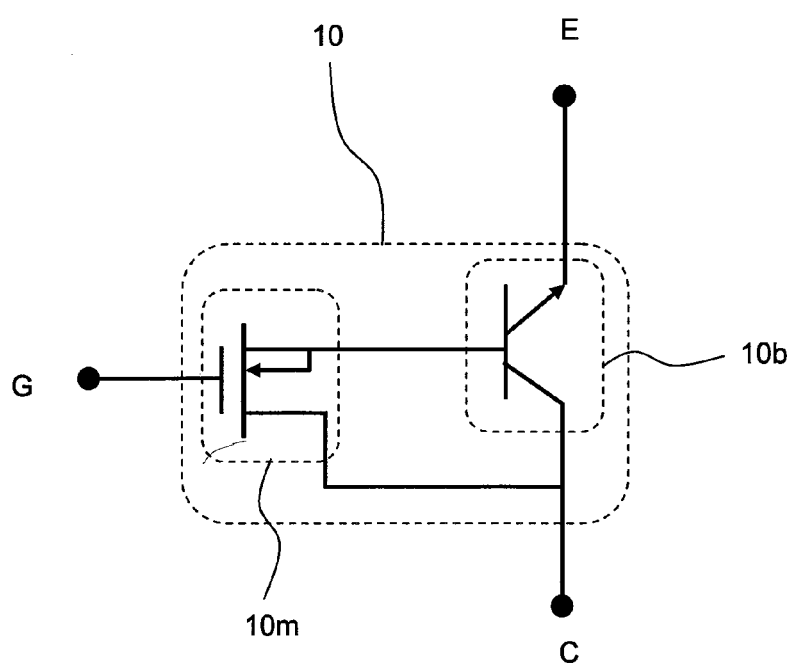
FIG. 2 is an equivalent circuit diagram of the IGBT device in FIG. 1.

FIG. 1 is an enlarged cross-sectional view for a cell portion of a non-punch through type IGBT device as an example of a device which is an object of a manufacturing method of a semiconductor device according to the embodiment of the present invention (it will be apparent that the invention is applicable also to a punch-through type IGBT device). FIG. 2 is an equivalent circuit diagram of the IGBT device in FIG. 1. With reference to FIG. 1 and FIG. 2, a vertical structure for the cell portion is to be described within a range necessary for explaining a relation between the warping of a wafer 1 and various metal films formed to the surface 1a and the rear face 1b of the wafer 1. Since a cell portion generally occupies a greater part of a chip region 2 (FIG. 4) of a power device, the relation of various films contributing to the warping of the wafer 1 can be recognized by reference to the vertical structure for the unit part of the cell portion comprising a plurality of unit cells.

As shown in FIG. 2, while an IGBT device 10 is divided, when viewed as the equivalent circuit, into a bipolar transistor portion 10b and an MOSFET portion 10m, both of them are united in an actual device structure. That is, as shown in FIG. 1, a rear face metal film 4 (second metal film) which is a collector electrode C is formed at the rear face 1b of the wafer 1, and a rear face P+ region 6p and a rear face N+ region (embedded N+ region) 6n are disposed on the rear side of an N type single crystal silicon substrate portion 1s. On the side of the surface of the N type single crystal silicon substrate portion 1s, that is, on the side of the surface of the wafer 1 in an N type drift region 7, a P type base region 9 that forms a channel region 8 is disposed, and a deeper deep P+ region 12 is disposed in a lower-half portion thereof. An N+ emitter region 11 is formed in the surface region of the P type base region 9. Over the surface of the N type single crystal silicon substrate portion 1s, that is, on the side of the surface of the semiconductor wafer 1 (first main surface or device surface) 1a, a gate peripheral insulation film 14 (gate insulation film and interlayer insulation film) is disposed, in which an N type gate polysilicon film 5 (polysilicon gate electrode) that is a gate electrode G is disposed. Over the upper surface of the cell portion, an emitter electrode E comprising, for example, mainly an aluminum type metal film, that is, a surface metal film (first metal film) 3 is disposed.

2. Explanation of a sputtering deposition apparatus and a plasma cvd apparatus, etc. Used for forming a reinforcing annular insulation film pattern in a manufacturing method of a semiconductor device according to an embodiment of the invention (mainly, with reference to FIG. 10 and FIG. 11)

Figure 10:
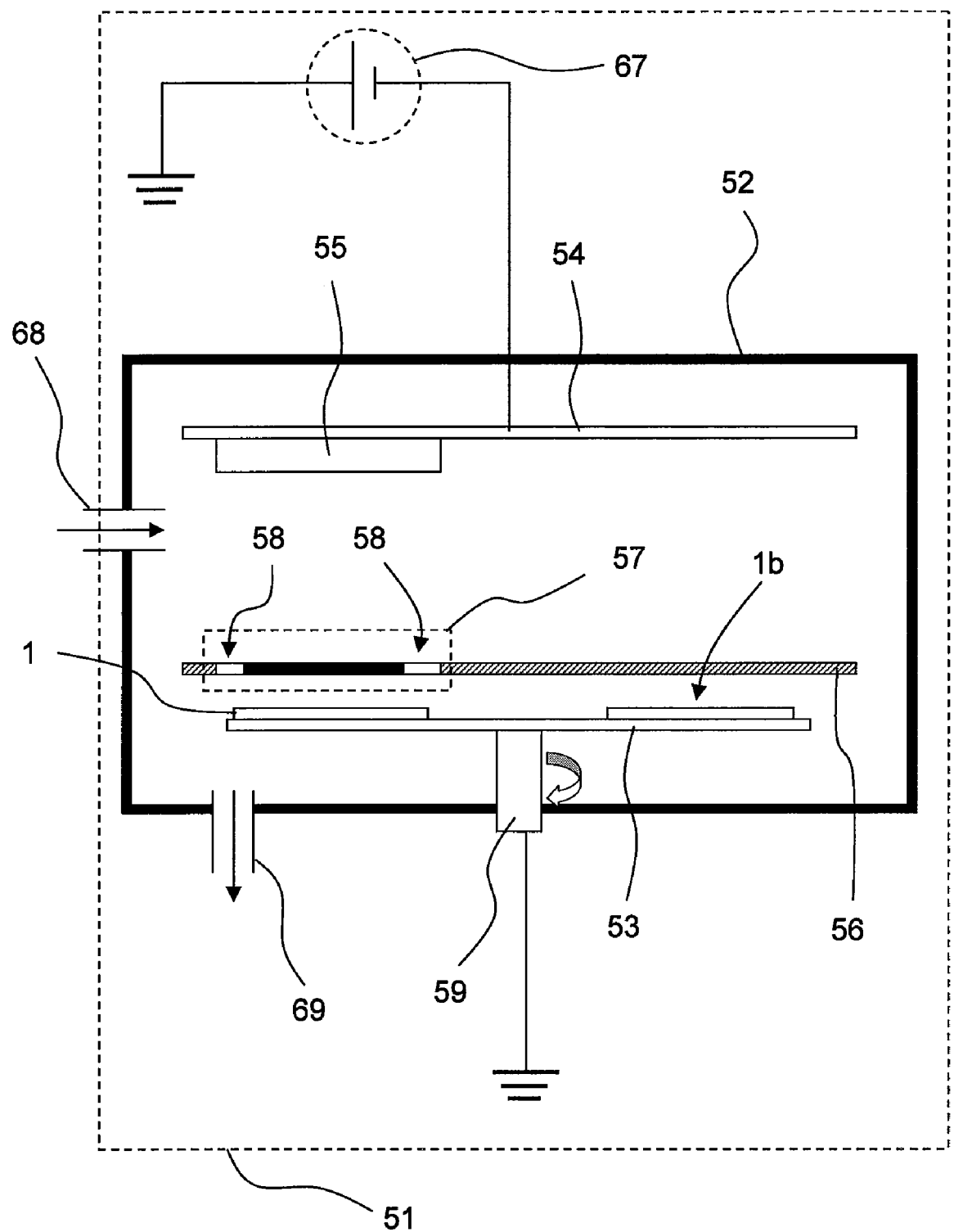
FIG. 10 is a schematic front cross-sectional view of a sputtering apparatus used for forming a reinforcing annular insulation film pattern in a manufacturing method of a semiconductor device according to one embodiment of the present invention.
Figure 11:
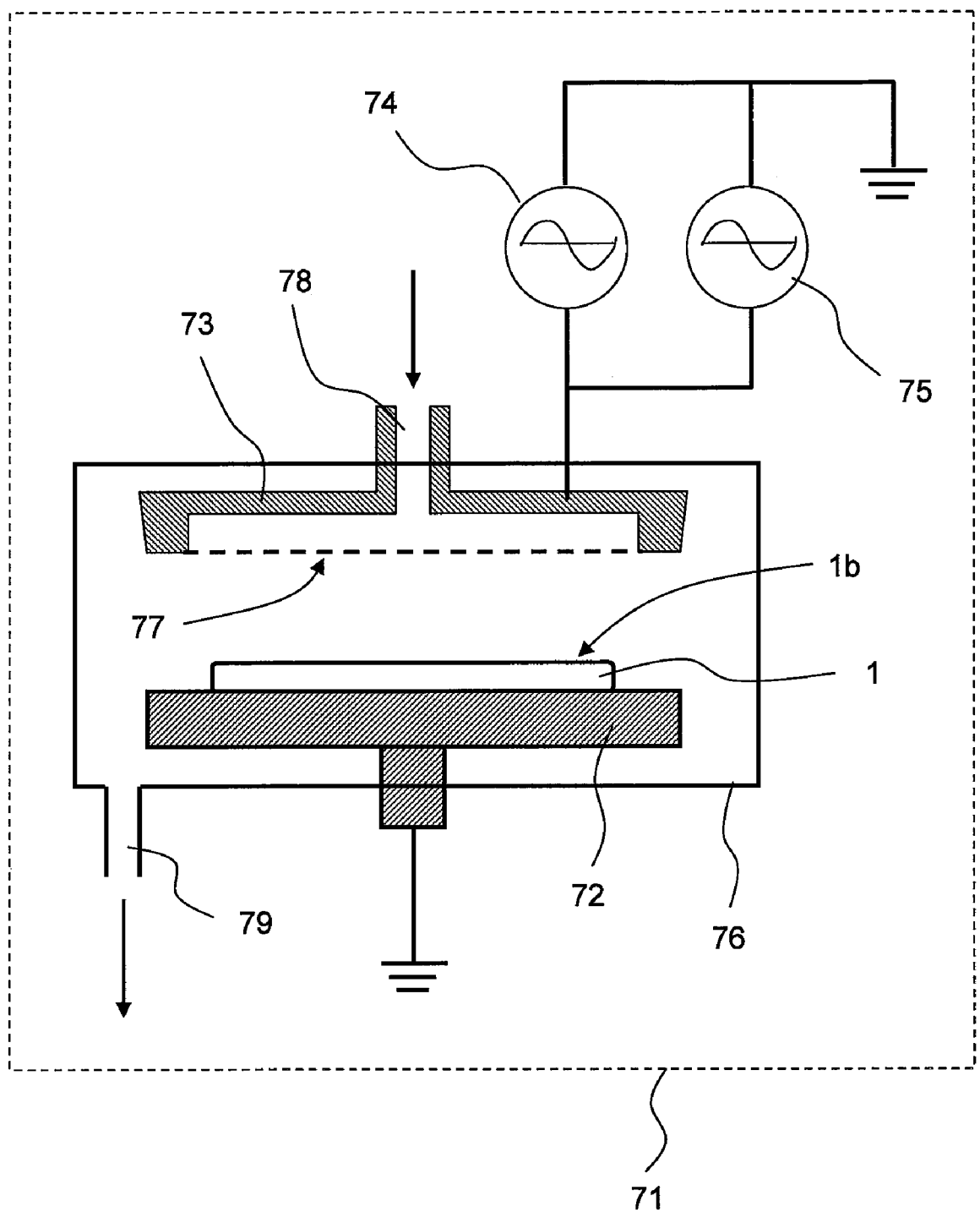
FIG. 11 is a schematic front cross-sectional view of a plasma CVD apparatus used for forming an insulation film as a base for a reinforcing annular insulation film pattern in a manufacturing method of a semiconductor device according to an embodiment of the present invention.

FIG. 10 is a schematic front cross-sectional view of a sputtering apparatus used for forming a reinforcing annular insulation film pattern in a manufacturing method of a semiconductor device according to the embodiment of the invention. FIG. 11 is a schematic front cross-sectional view of a plasma CVD apparatus used for forming an insulation film as a base of a reinforcing annular insulation film pattern in the manufacturing method of the semiconductor device according to the embodiment of the invention.

A sputtering apparatus 51 in FIG. 10 has a feature capable of forming a reinforcing annular insulation film pattern 15 (refer to FIG. 12) directly on a wafer 1. The sputtering deposition is so-called reactive sputtering deposition. As shown in FIG. 10, a lower electrode (wafer stage) 53 held by a rotary shaft 59 is disposed in the inner lower part of a sputtering deposition chamber 52, and a plurality of wafers 1 to be processed are set thereover with the rear face 1b being directed upward. The lower electrode 53 is grounded. An upper electrode (target backing plate) 54 that holds a silicon target 55 at the lower surface thereof is disposed in the inner upper portion of the sputtering deposition chamber 52. The upper electrode 54 is coupled to the negative electrode of a DC power source 67, and the positive electrode of the DC power source 67 is grounded. A fixed shutter 56 is disposed at a position between the upper electrode 54 and the lower electrode 53 and close to the lower electrode 53, and a portion thereof forms a shadow mask 57. By the presence of an annular opening 58 at the periphery thereof (which is held at several positions to the peripheral portion by a support member in the form of a fine lead), a silicon nitride film is deposited by sputtering only to the periphery at the rear face (second main surface) 1b of the wafer 1 situated just below. In a case of processing other wafers, the wafer stage 53 is rotated by the rotary shaft 59 such that an intended wafer is situated just below the shadow mask 57.

When reactive sputtering deposition of the silicon nitride film is conducted, the inside of the sputtering deposition chamber 52 is evacuated to a predetermined vacuum degree by an evacuation exhaustion system from an exhaust port 69 while supplying a nitrogen gas from a gas introduction port 68.

A plasma CVD apparatus 71 in FIG. 11 is an example of a plasma CVD apparatus for deposition of a silicon nitride film which is used when a reinforcing annular insulation film pattern 15 (refer to FIG. 12) is formed by the combination of entire uniform film formation and usual lithography. As shown in FIG. 11, a lower electrode (wafer stage) 72 is disposed in the inner lower portion of a plasma CVD deposition chamber 76, on which a wafer 1 to be processed is set with the rear face 1b thereof being directed upward. The lower electrode 72 is grounded. An upper electrode 73 having a shower head 77 at the lower end thereof is disposed in the inner upper portion of the plasma CVD deposition chamber 76. The upper electrode 73 is coupled, for example, to a high frequency power source 74 (13.56 MHz) and a low frequency power source 75 (250 KHz) (it is possible to turn one of them or both of them to on or off). The other end of each power source is grounded. A gas introduction port 78 is disposed in the upper electrode 73, through which a reaction gas is supplied during film deposition. Further, the inside of the plasma CVD deposition chamber 76 is evacuated to a predetermined vacuum degree by a evacuating exhaust system from an exhaustion port 79 during film deposition.

3. Explanation for process flow, etc. for manufacturing method of a semiconductor device according to an embodiment of the invention (mainly, with reference to FIG. 3, FIG. 4 to FIG. 9, and FIG. 12 to FIG. 20)

Figure 3:
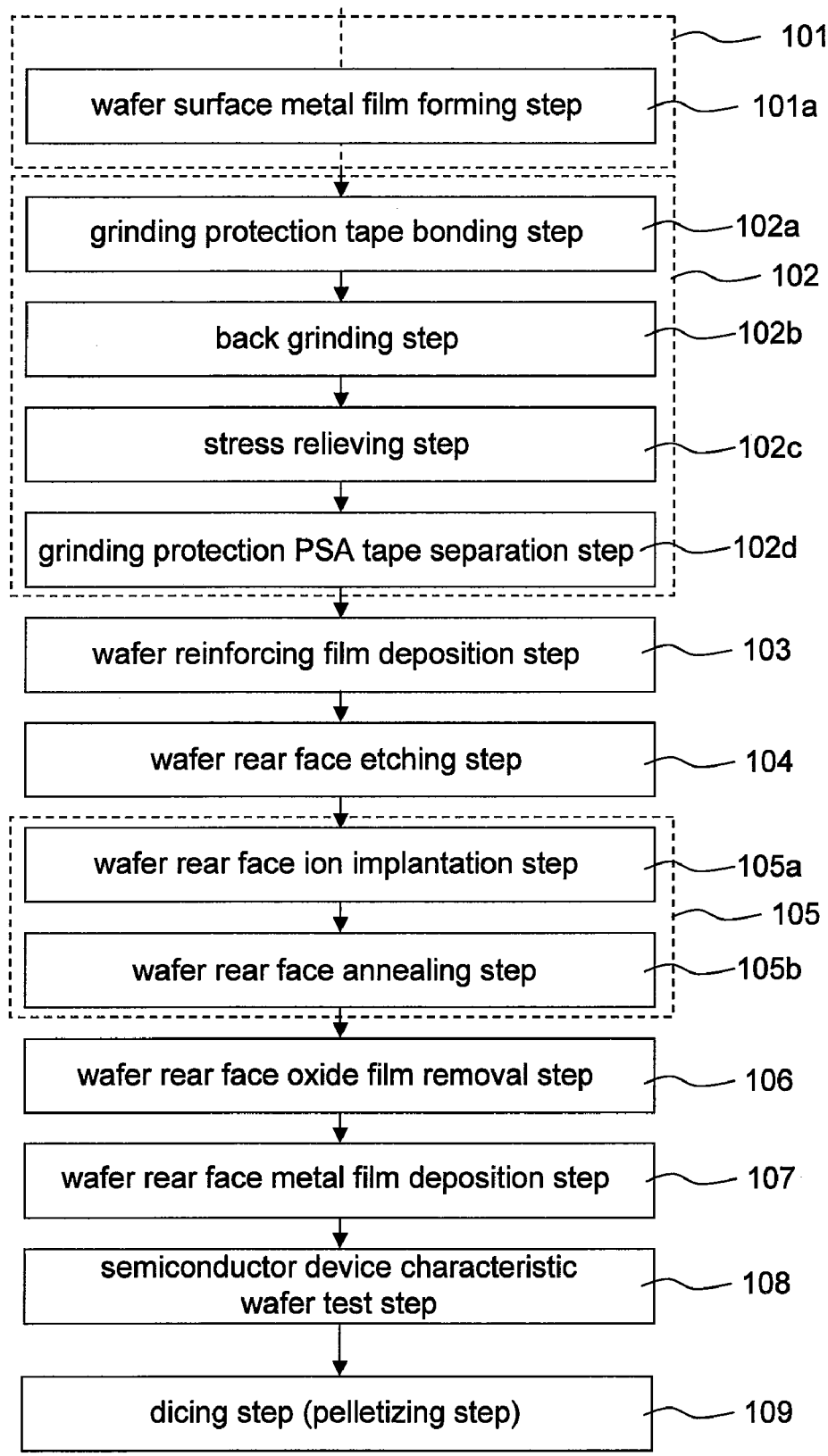
FIG. 3 is a main process block flow chart for a manufacturing method of a semiconductor device in one embodiment of the present invention.
Figure 12:
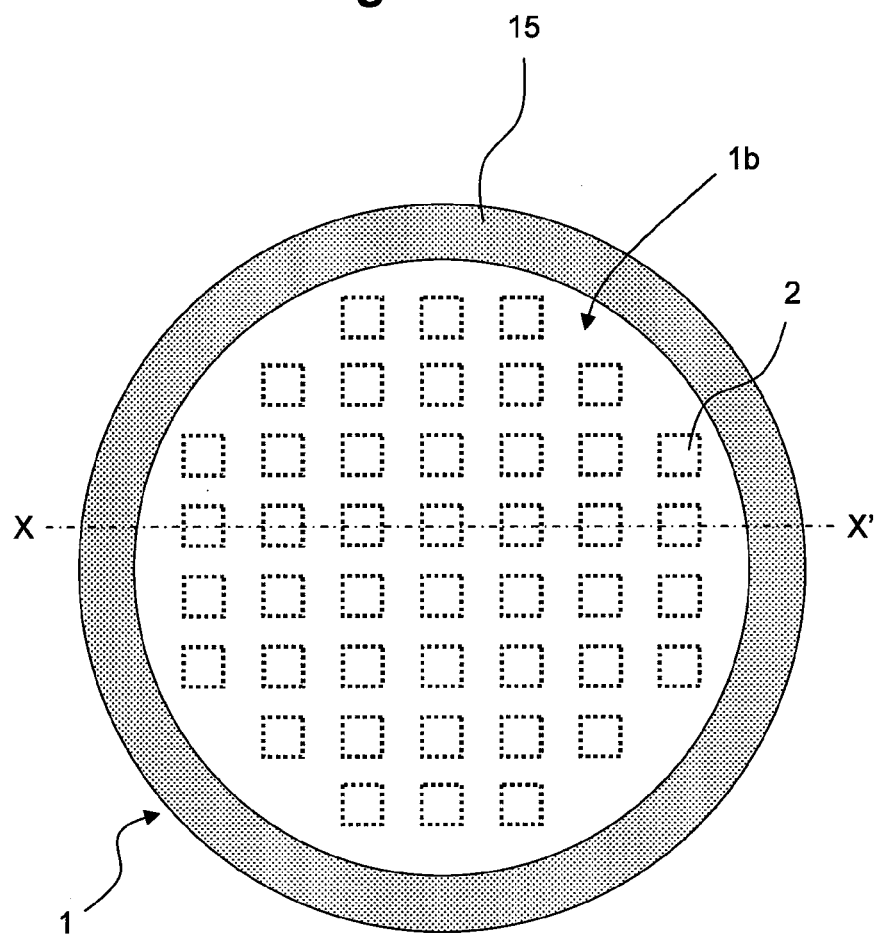
FIG. 12 shows a device rear face view corresponding to FIG. 3 (at the time of completing formation of a reinforcing annular insulation film pattern)
Figure 13:
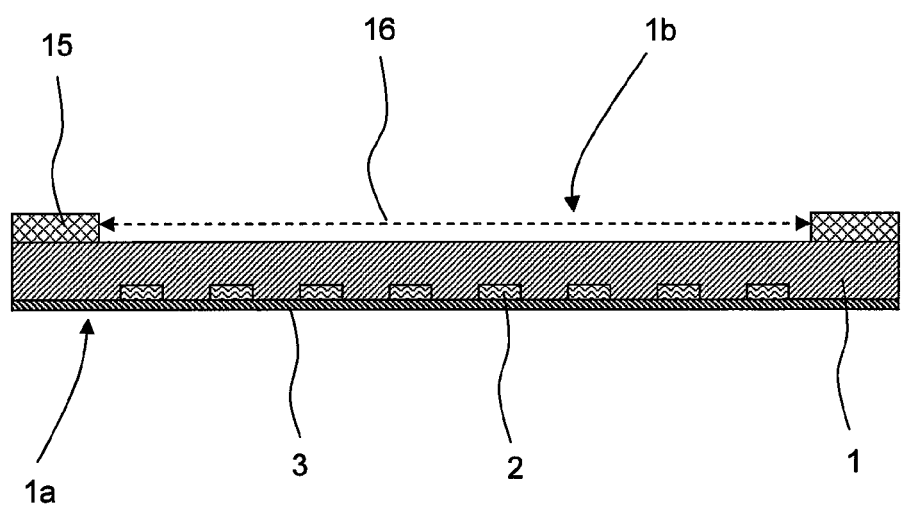
FIG. 13 is a device cross-sectional view corresponding to X-X' in FIG. 12.
Figure 18:
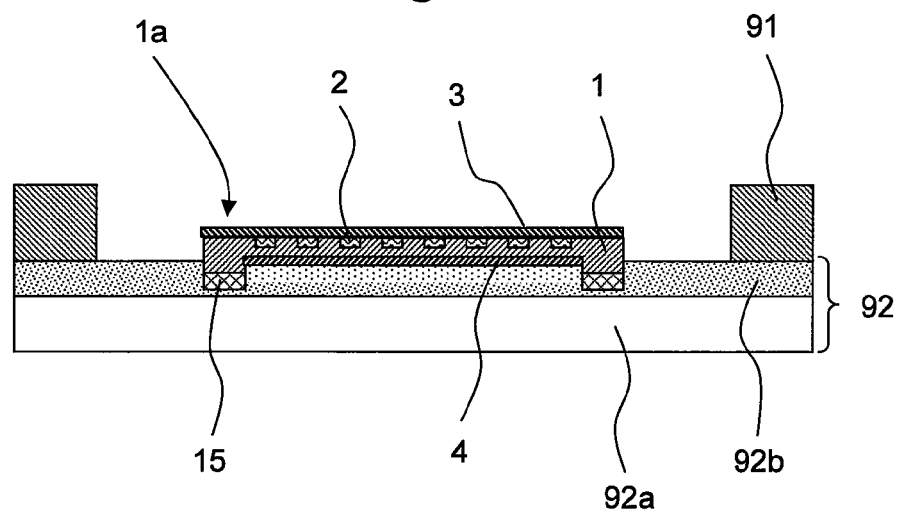
FIG. 18 is a process flow chart showing the device cross section (wafer bonding step to dicing tape) corresponding to FIG. 3.
Figure 19:
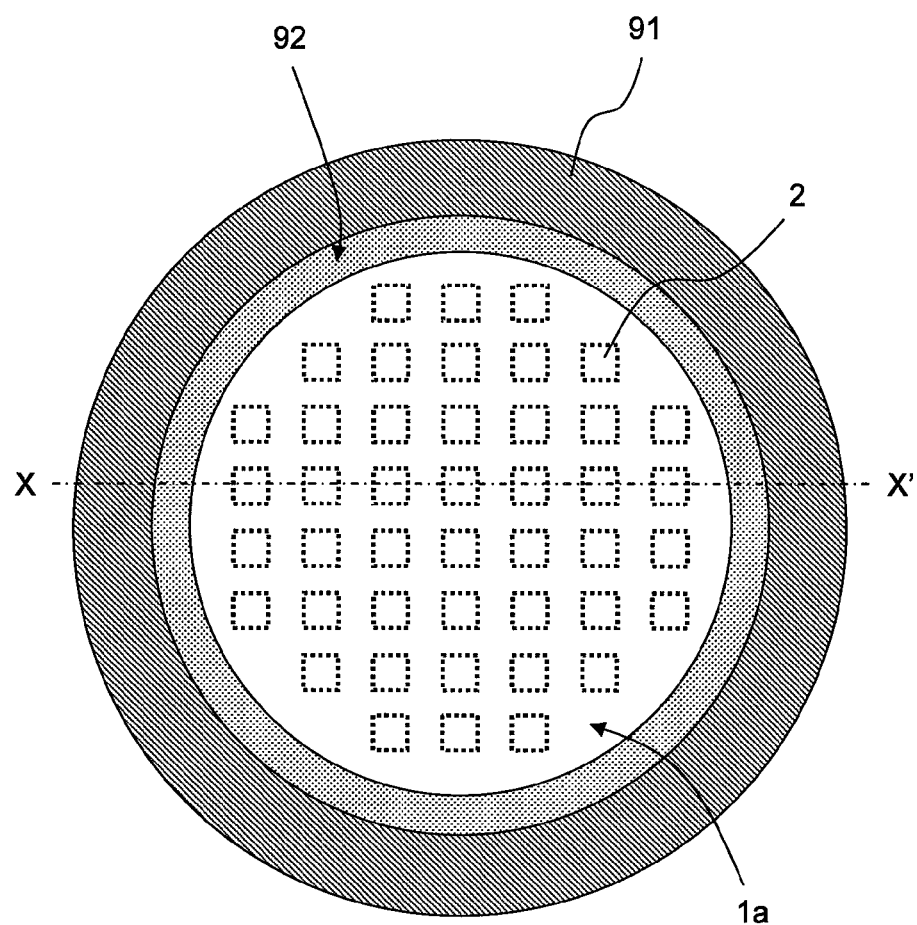
FIG. 19 is a device surface (on the surface side) view (dicing step) corresponding to FIG. 3.
Figure 20:
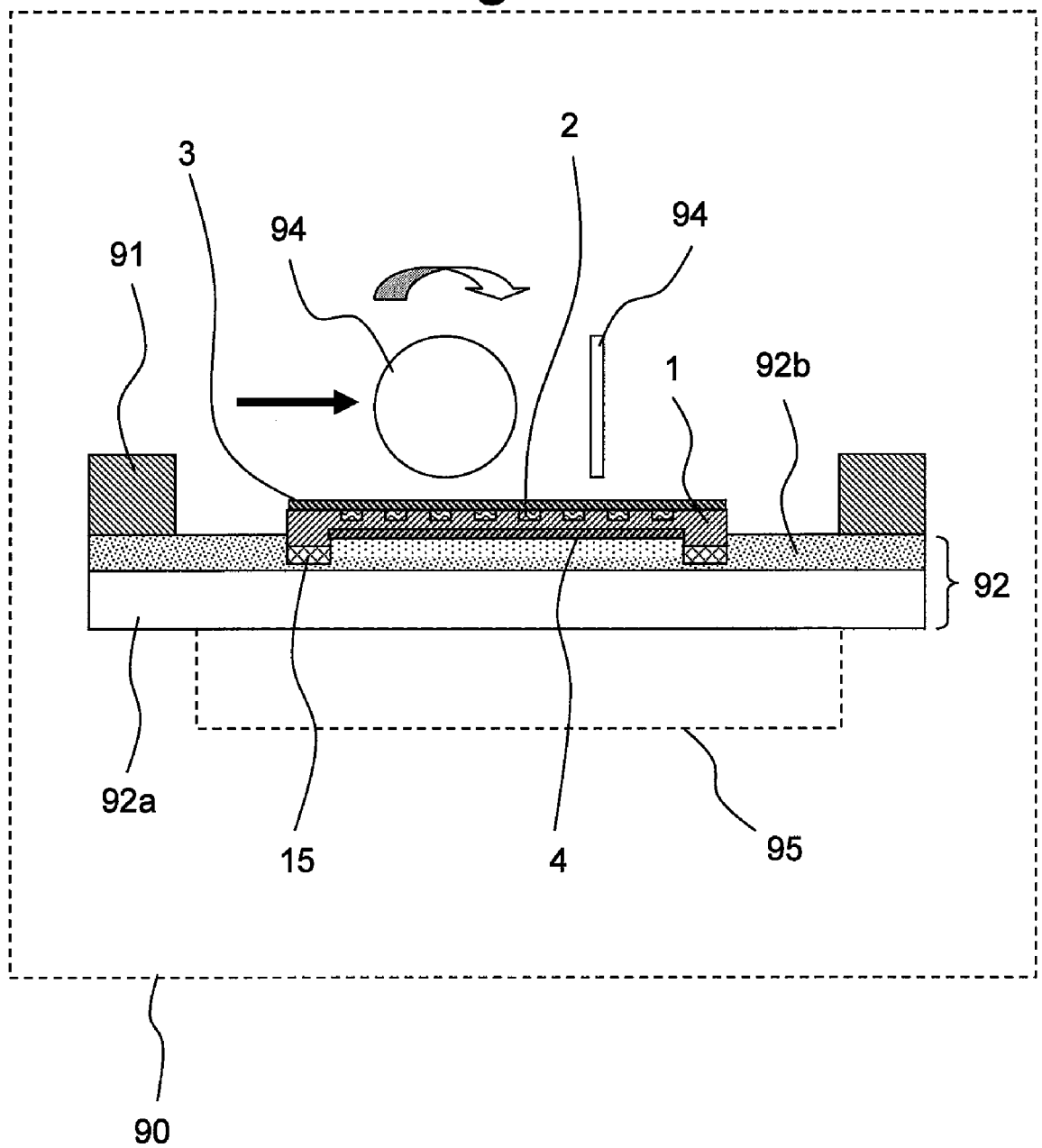
FIG. 20 is a device cross-sectional view corresponding to X-X' in FIG. 19.

FIG. 3 is a main process block flow chart for a manufacturing method of a semiconductor device according to an embodiment of the invention. FIG. 12 is a device rear face view corresponding to FIG. 3, and FIG. 19 is a device surface (on the side of the surface) view corresponding to FIG. 3 (dicing step). FIG. 4 to FIG. 9, FIG. 13 to FIG. 18, and FIG. 20 are process flow charts showing device cross sections corresponding to FIG. 3. FIG. 12 is a device rear face view (at the instance of completing the formation of a reinforcing annular insulation film pattern) corresponding to FIG. 3. FIG. 19 is a device surface (on the side of the surface) view corresponding to FIG. 3 (dicing step). Among them, FIG. 13 is a device cross-sectional view corresponding to X-X' in FIG. 12, and FIG. 20 is a device cross-sectional view corresponding to X-X' in FIG. 19. Main portions of a manufacturing process, etc. are to be described hereinafter with a view point of warping of the wafer. Description is to be made herein for a 150 φ wafer as an example.

Figure 4:
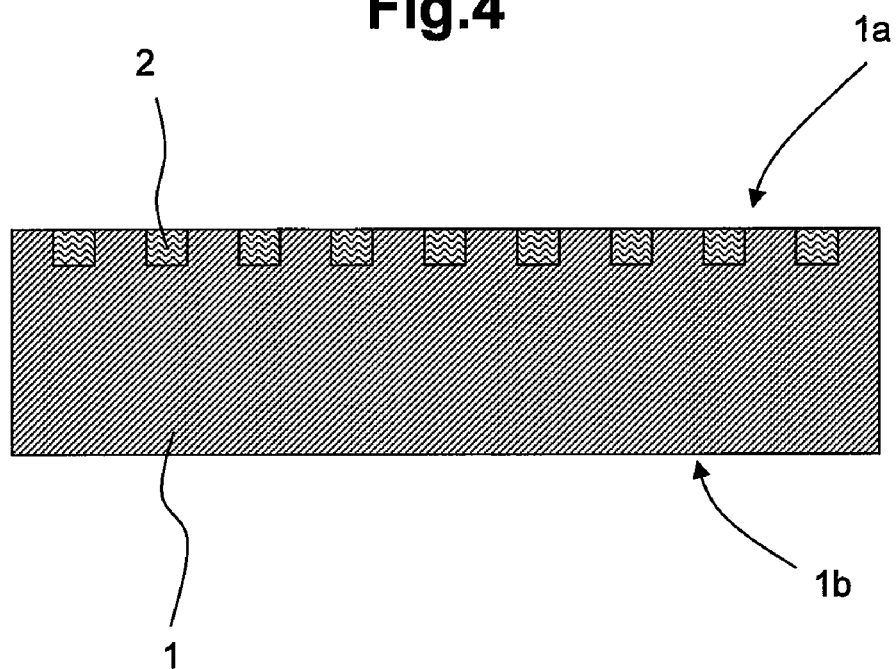
FIG. 4 is a process flow chart showing the device cross section (before forming surface metal film) corresponding to FIG. 3.

At first, as shown in FIG. 3, while a wafer surface processing step group 101 (first main surface processing step group) comprises various steps, since a wafer surface metal film forming step 101a (first metal film forming step) mainly contributes to the warping of the wafer, description is to be made starting from the state before forming the surface metal film 3 (first metal film) in FIG. 1. As shown in FIG. 4, a semiconductor device region 2 (chip region) is formed on the surface side 1a of an N type single crystal silicon substrate 1 (first main surface or device surface). In this stage, the rear face metal film 4 (second metal film), the rear face P+ region 6p, the embedded N+ region 6n, the surface metal film 3 (first metal film), etc. in FIG. 1 are not yet formed. While description is to be made specifically to a case of a wafer diameter of 150 φ (substantially disk-like shape with a diameter of about 150 mm) as an example, 100 φ, 200 φ, 300 φ, 450 φ, etc. can be utilized in addition to 150 φ.

Figure 5:
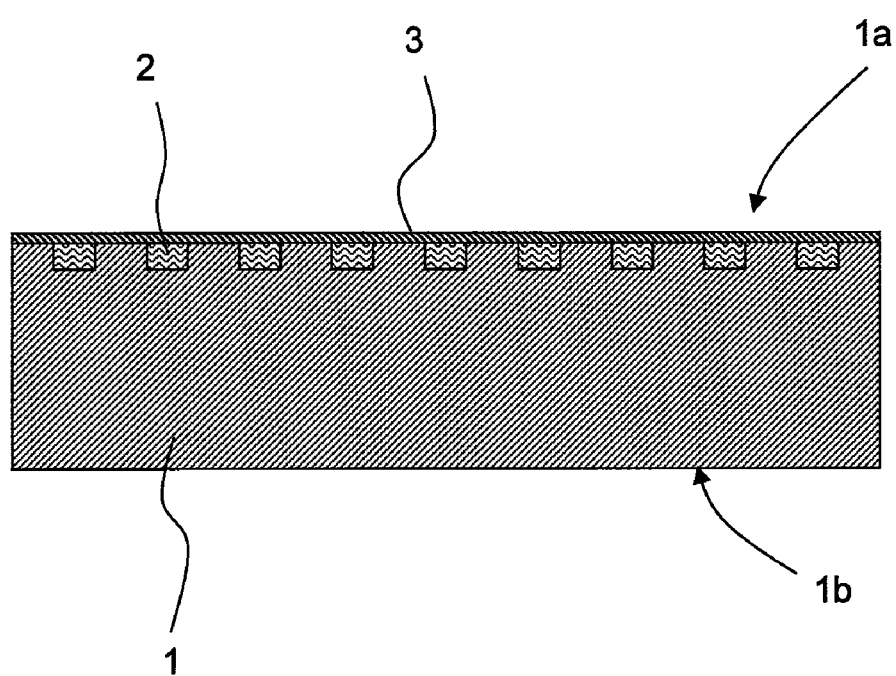
FIG. 5 is a process flow chart showing the device cross section (after forming surface metal film) corresponding to FIG. 3.

Then, as shown in FIG. 5, a surface metal film 3 (first metal film) is formed substantially over the entire surface of a surface side 1a of a wafer 1, for example, by sputtering film deposition (first metal film forming step 101a in FIG. 3). The configuration of the surface metal film 3 can include, for example, those comprising a barrier metal film (for example, TiW or Ti/TiN composite film) for a lower layer and an aluminum type metal layer (for example, silicon-added aluminum or copper-added aluminum) for an upper layer. The thickness for the barrier metal film of the lower layer is, for example, about 200 nm (preferably, in a range about from 100 nm to 300 nm) and that for the aluminum type metal film of the upper layer is, for example, about 1200 nm (preferably in a range about from 1000 nm to 3000 nm).

Then, the surface metal film 3 is patterned by the usual lithography. Then, a final passivation film is optionally formed and fabricated.

Figure 6:
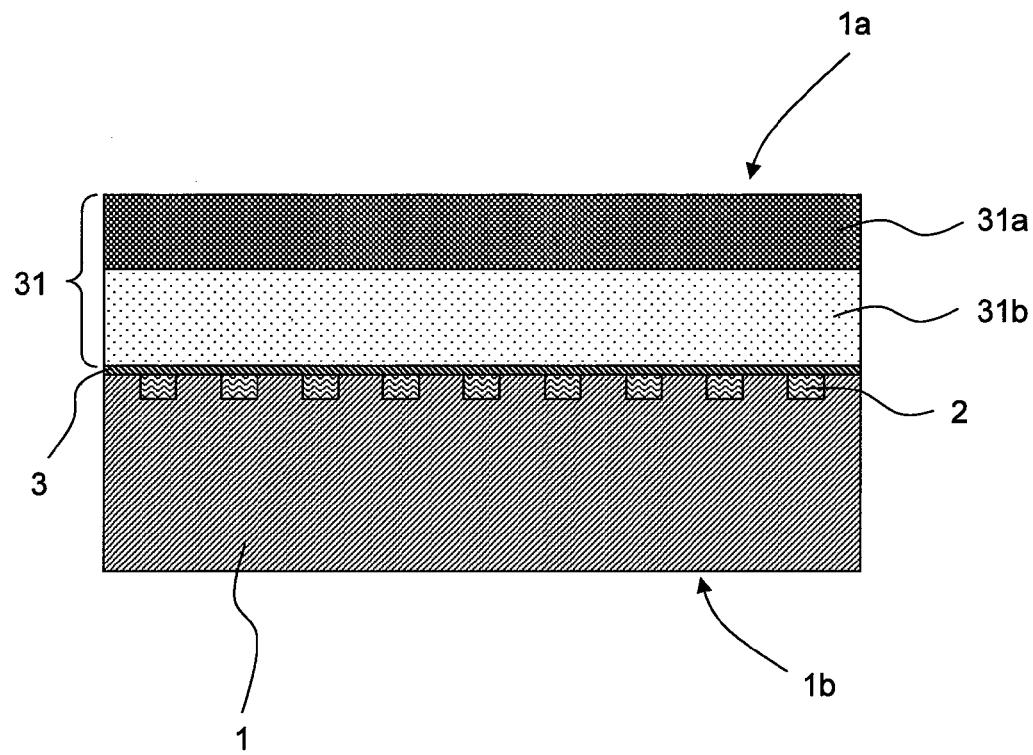
FIG. 6 is a process flow chart showing the device cross section (after bonding BG tape) corresponding to FIG. 3.

Then, the process goes to a back grinding (BG) step group 102 in FIG. 3. As shown in FIG. 6, a BG protection tape 31 comprising a base member 31a, a pressure sensitive adhesive (PSA) layer 31b, etc. (wafer surface protection tape) is bonded substantially over the entire surface of the surface side 1a of the wafer 1 (grinding protection tape bonding step to the wafer surface 102a in FIG. 3). The wafer thickness at this instance is a first thickness. Since the thickness of the wafer is relatively large at this instance, warping of the wafer gives relatively less remarkable effect on the transportation or specific processing. The first thickness of the wafer in this case is, for example, about 550 µm and a preferred range is usually about 230 µm or more and less than 1 mm.

Figure 7:
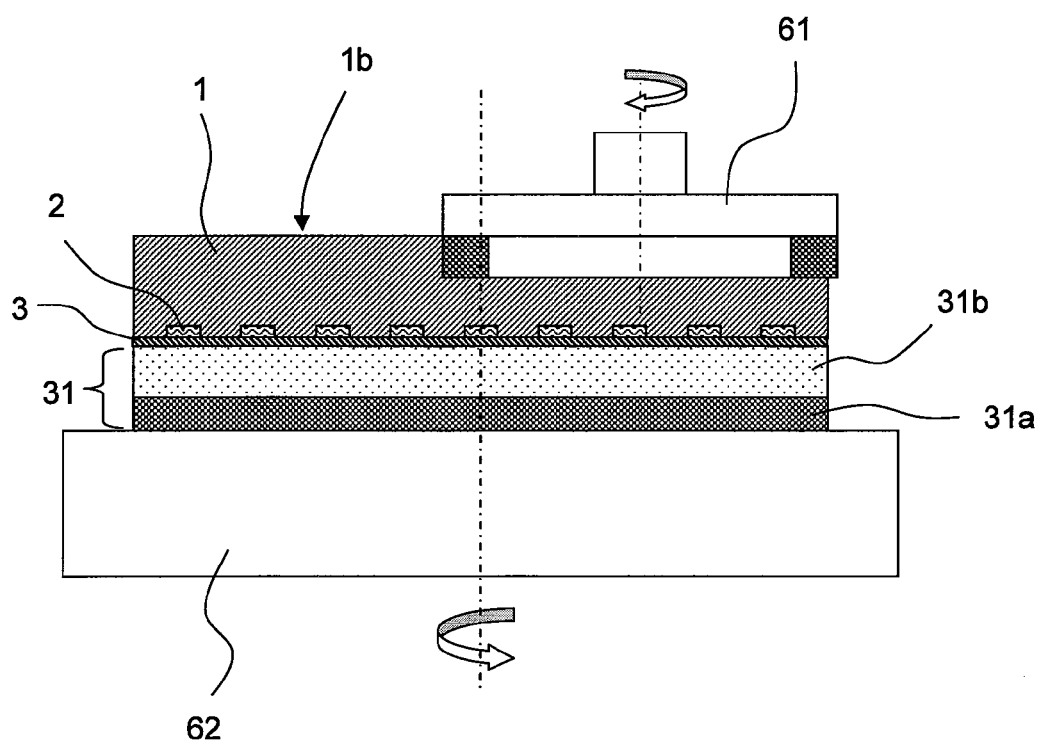
FIG. 7 is a process flow chart showing the device cross section (during a BG step) corresponding to FIG. 3.

In this state, a back grinding step 102b (FIG. 3) is conducted as shown in FIG. 7. As shown in FIG. 7, by grinding the rear face 1b (second main surface) of the wafer 1 by a BG wheel 61 in a state of adsorbing the surface side 1a of the wafer 1 to a wafer adsorption rotary table 62 in rotation, the thickness of the wafer is reduced to a second thickness thinner than the first thickness. In this case, the second thickness of the wafer is, for example, about 150 µm and, usually, it is preferably in a range of 70 µm or more and less than about 230 µm (preferably, in a range of 100 µm or more and less than 200 µm).

Figure 8:
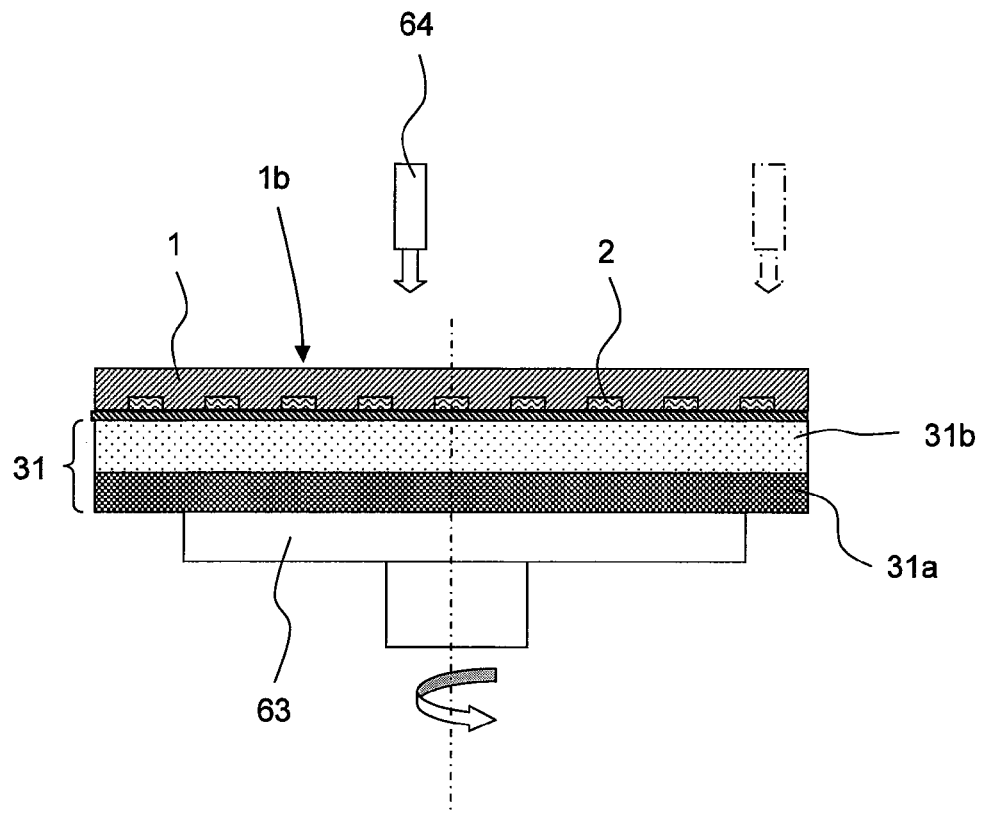
FIG. 8 is a process flow chart showing the device cross section (stress relief step after BG bonding) corresponding to FIG. 3.

Then, as shown in FIG. 8, a stress relief step 102c (FIG. 3) is conducted for removing a damaged layer formed in the back grinding step 102b (FIG. 3). While there are various stress relieving methods, a thin damaged layer at the surface is removed by a method of supplying a silicon etching solution to the rear face 1b of the wafer 1 by an etching chemical solution nozzle 64 in a state of adsorbing the device surface 1a of the wafer 1 being attached with the BC protection tape 31 over the rotary etching stage 63 as shown in FIG. 8.

Figure 9:
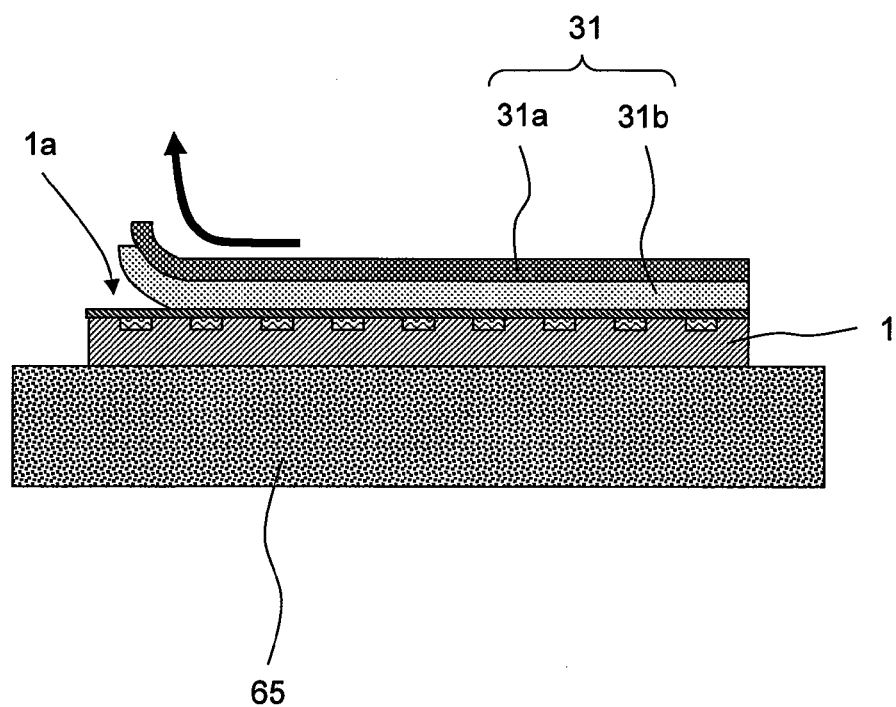
FIG. 9 is a process flow chart showing the device cross section (BG tape separating step) corresponding to FIG. 3.

Then, a BG tape separation step 102d in FIG. 3 is conducted. As shown in FIG. 9, the wafer surface protection tape 31 is peeled entirely in a state of adsorbing the rear face 1b of the wafer 1 to the heated wafer adsorption stage 65. At this instance, since the wafer 1 is in a state where a thick metal film is formed only on the surface 1a thereof and the wafer thickness is reduced, it is expected that the effect of warping may develop.

Then, a wafer reinforcing film deposition step 103 in FIG. 3 (wafer reinforcing film pattern forming step) is conducted by using any one of the apparatus that has been described above in the section 2. As shown in FIG. 12 and FIG. 13, an annular inorganic insulation film pattern 15 (for example, silicon nitride type insulation film such as a silicon nitride film) is formed on the rear face 1b of the wafer 1 (second main surface) along the periphery of the rear face 1b. Accordingly, a circular opening 16 is present in the inside of the annular insulation film pattern 15. Different from an organic insulation film, the inorganic insulation film, particularly, the silicon nitride type insulation film has a relatively strong stress and can provide a strong stress even in a case of a relatively thin film. Further, the silicon nitride insulation film has an advantage of being able to change the stress value relatively simply by controlling a pressure, a gas flow rate, etc. during sputter film deposition.

The warp moderating insulation film pattern 15 can be formed by a relatively simple process by sputtering film deposition using the shadow mask as shown in FIG. 10 (selective film deposition). Various conditions for film deposition in this case include, for example, a film thickness of about 500 nm (width of the annular insulation film pattern 15 is, for example, about 4 mm), a tensile film stress of about 200 M Pascal, a vacuum degree of about 0.2 Pascal, a wafer stage temperature of about 150° C., an applied power of about 300 W, a nitrogen gas flow rate of about 35 sccm, an argon gas flow rate of about 15 sccm, and a film deposition time of about 170 min.

Further, the warp moderating dielectric film pattern 15 can be formed without using any special apparatus by a two-stage process comprising a combination of CVD (plasma CVD) using a CVD apparatus as illustrated in FIG. 11 and lithography. With respect to the film deposition time, the process can be conducted much more rapidly by CVD. Further, the pattern can be formed without using special apparatus by a two-stage process comprising a combination of not-selective sputtering film deposition and lithography. Various conditions for film deposition in this case (using the apparatus in FIG. 11) include, for example, a film thickness of about 1200 nm (width of the annular insulation film pattern 15 is, for example, about 4 mm), a tensile strength of film stress of about 200 M Pascal, a vacuum degree of about 350 Pascal, a wafer stage temperature of about 400° C., an applied high frequency power (13.56 MHz) of about 300 W, a low frequency applied power (250 kHz) of about 300 W, a nitrogen gas flow rate of about 1600 sccm, a monosilane gas flow rate of about 500 sccm, an ammonia gas flow rate of about 4500 sccm, and a film deposition time of about 11 min.

Since warping opposite to that of the surface metal film 3 is provided to the wafer 1 by the warp moderating insulation film patter 15, the wafer can be held easily for handling or processing as a result of offsetting warping even in a state of not using a special support plate, etc.

While an annular shape is shown as an example for the warp moderating insulation film pattern 15, this means not only a geometrical annular ring but the pattern may be, for example, a substantially annular shape corresponding to a region at the periphery of the wafer where the product chip is not present (chip absent region and non-product chip region).

Figure 14:
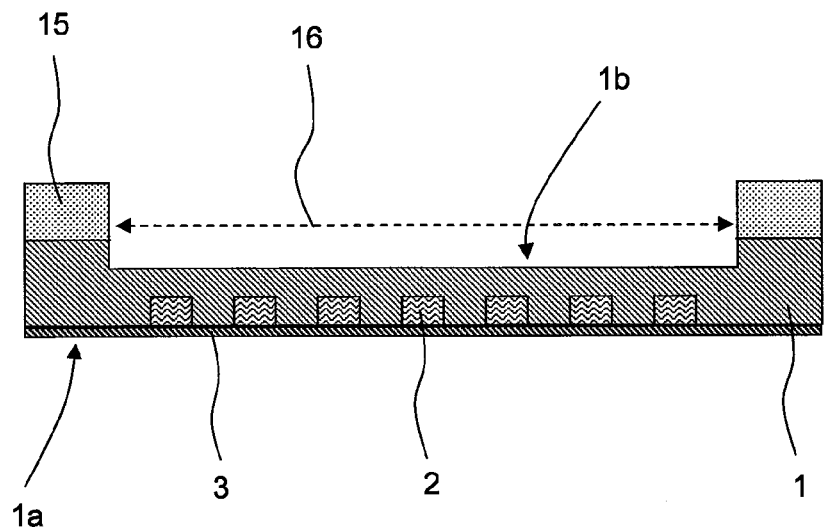
FIG. 14 is a process flow chart showing the device cross section (etching step to wafer rear face) corresponding to FIG. 3.

Then, after attaining the state with relatively less warping as described above (the thickness of the wafer at this instance is substantially identical with the second thickness), as shown in FIG. 14, the rear face 1b of the wafer 1 (second main surface) where a number of semiconductor device regions are present, that is, a portion of the circular opening 16 has with thickness-reduction processing appled by grinding (for example, back grinding by a wheel) or etching (for example, wet etching) to a third thickness (thinner than the second thickness) corresponding to a final device thickness as shown in FIG. 14 (wafer rear face etching step 104 in FIG. 3). The third thickness of the wafer herein is, for example, about 85 µm and, usually, a range of about less than 200 µm and 30 µm or more is preferred. The thickness of the wafer is reduced as described above in order to lower the on resistance of the device, etc.

Figure 15:
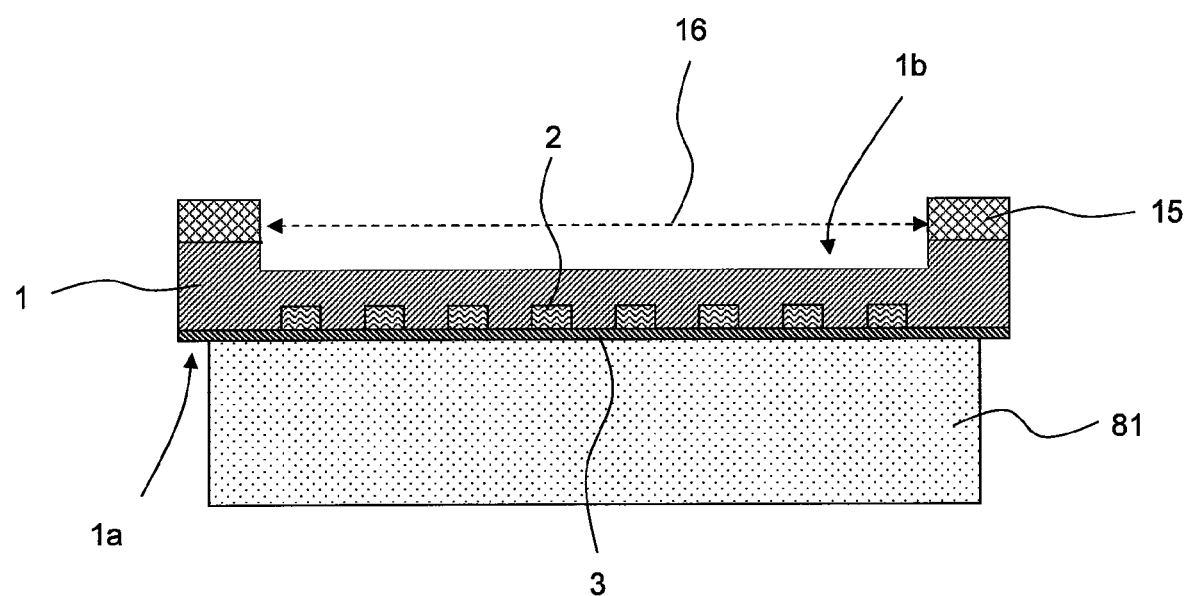
FIG. 15 is a process flow chart showing the device cross section (ion implantation step to wafer rear face) corresponding to FIG. 3.

Then, the process goes to the processing of the wafer rear face ion implantation step group 105 in FIG. 3. At first, a wafer rear face ion implantation step 105a is conducted for forming a rear face P⁺ region 6p. As shown in FIG. 15 predetermined P-type impurities, etc. are, for example, ion implanted to the rear face 1b of the wafer 1 in a state of adsorbing the device surface 1a of the wafer 1 to a wafer adsorption stage 81. In this case, since the warp moderating insulation film pattern 15 is present at the rear face 1b of the wafer 1, there is no trouble in the entry of the wafer into the ion implantation apparatus, holding of the wafer (electrostatic adsorption) at the inside thereof, delivery of the wafer therefrom, etc. Successively, a wafer rear face activation annealing step 105b in FIG. 3 is conducted.

When it is necessary to form the rear face N⁺ region 6n in FIG. 1, this may be attained by repeating ion implantation and annealing for predetermined N-type impurities in the same manner as in the previous wafer rear face ion implantation step group 105.

Figure 16:
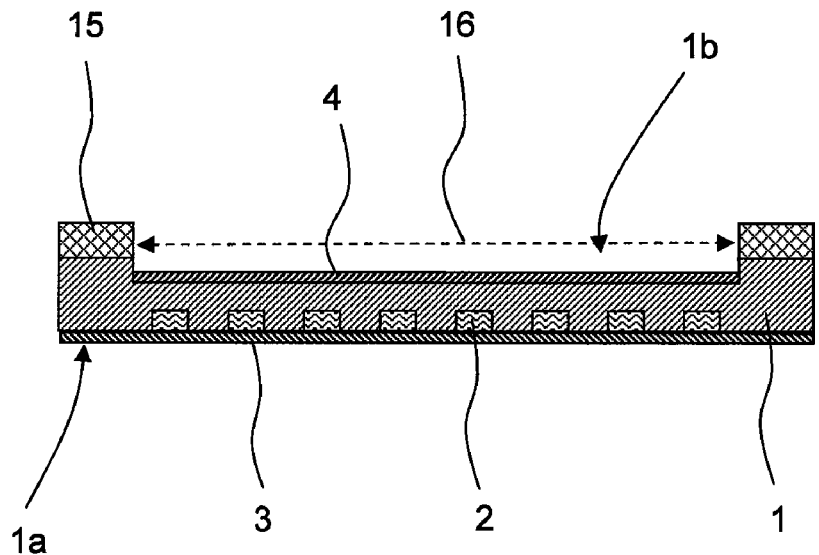
FIG. 16 is a process flow chart showing the device cross section (metal film deposition step to wafer rear face) corresponding to FIG. 3.

Then, as a pretreatment for the formation of the rear face metal film, a wafer rear face oxide film removal 106 in FIG. 3 is conducted. Successively, as shown in FIG. 16, a rear face metal film (second metal film) 4 is formed to the rear face 1b of the wafer 1 (annular opening 16)(wafer rear face metal film deposition step (second metal film forming step) 107 in FIG. 3), for example, by sputtering deposition. While the wafer 1 warps somewhat by the formation of the rear face metal film 4, since the warp moderating insulation film pattern 15 is present at the rear face 1b of the wafer 1, the basic state of warping is relatively small and such a large warp as making the handling difficult less occurs.

Figure 17:
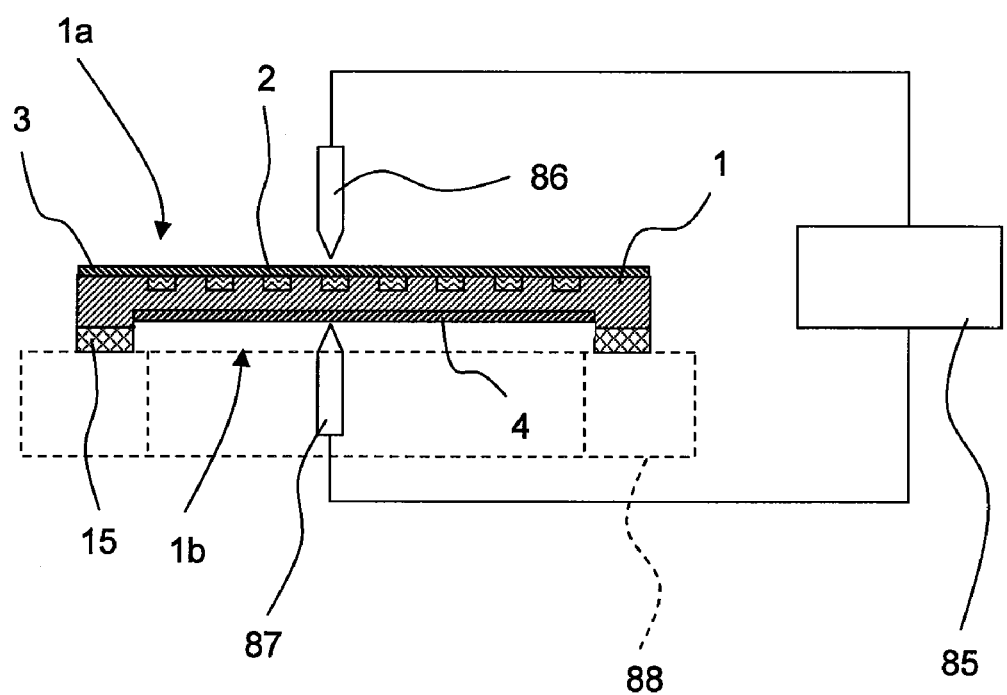
FIG. 17 is a process flow chart showing the device cross section (wafer probe step) corresponding to FIG. 3.

Then, a wafer test step 108 in FIG. 3 is conducted. As shown in FIG. 17, in a state of adsorbing the rear face 1b of the wafer 1 to a wafer adsorption stage 88 of a wafer prober 85, a surface probe needle 86 and a rear face probe needle 87 are brought into contact respectively to a semiconductor device region 2 (chip region) to be tested at the surface 1a and the rear face 1b of the wafer 1 to conduct an electric test. The problem of the warping of the wafer in this step is substantially identical with that in the wafer rear face oxide film removal 106 as a previous step.

Then, a dicing step 109 (pelletizing step) in FIG. 3 is conducted. As shown in FIG. 18, a rear face 1b of the wafer 1 is bonded to a pressure sensitive adhesive layer 92b of a dicing wafer holding frame 91 bonded with a dicing tape 92 comprising a base portion 92a and a pressure sensitive adhesive layer 92b. In this case, since the warp moderating insulation film pattern 15 is present at the rear face 1b of the wafer 1, the basic state of warping is relatively small, and such a large warping as making the handling difficult less occurs, and the bonding operation can be automatically conducted relatively easily. In this state, as shown in FIG. 19, the wafer 1 is separated into individual semiconductor device regions 2 (chip region) by cutting along longitudinal and lateral dicing lines (scribe lines). That is, as shown in FIG. 20, in a state of vacuum attracting a dicing wafer holding frame 91 to which the wafer 1 is fixed to a vacuum adsorption wafer stage 95 of a dicing apparatus 90, the wafer 1 is cut along vertical and lateral dicing lines (scribe lines) by a dicing blade 94. After cutting, since the size of the chip 2 is relatively small, warping does not result in a significant problem in view of delivery or handling. Separation into the chips may be conducted by a laser alone or in combination with a blade dicing.

4. Summary

While the invention made by the present inventors has been described specifically with reference to the preferred embodiment, it will be apparent that the invention is not limited to it but can be modified variously within a range not departing from the gist thereof.

For example, in the embodiment described above, while description has been made specifically to a planer type IGBT device as an example, it will be apparent that the invention is not limited thereto and is applicable in the same manner also to a trench gate type IGBT device, etc. Further, while the description has been made specifically for the embodiment described above to the IGBT device as an example of the power transistor device, it will be apparent that the invention is not limited thereto but is applicable in the same manner also to a planer type or trench gate type power MOSFET (power MISFET), etc. In the embodiment described above, while description has been made of the example of using a single crystal substrate (specifically, N-type single crystal silicon wafer) such as a silicon type wafer, it will be apparent the invention is not limited thereto but is also applicable in the same manner to those using a silicon type epitaxial substrate and a GaAs type compound semiconductor substrate. Further, in the embodiment described above, while the description has been made specifically to a wire connection type device intended to be coupled with the outside by wire bonding as an example, it will be apparent that the invention is applicable also to bump products in which a UBM (Under Bump Metal) film made of nickel or the like is disposed further over the metal electrode on an upper surface of the chip and bump electrodes, etc. are formed thereover. Further, in the embodiment described above, while an example of forming an aluminum type metal film at a relatively large thickness and for a wide area as the main metal film at the upper surface is shown, it will be apparent that the invention is not limited thereto but is applicable also to those using copper type metals or refractory metals such as titanium type or tungsten type such as TiW (for example, 10% titanium and 90% tungsten).

What is claimed is:

1. A manufacturing method of a semiconductor device comprising the steps of:
    (a) forming a first metal film over a first main surface of a semiconductor wafer having a first thickness;
    (b) conducting, after the step (a), back grinding to a second main surface of the semiconductor wafer thereby making a second thickness thinner than the first thickness;
    (c) forming, after the step (b), an insulation film pattern comprising a first insulation film and containing an annular insulation film pattern along the periphery of a second main surface of the semiconductor wafer over the second main surface along the periphery thereof;
    (d) making the thickness for the opening of the annular insulation film pattern to a third thickness which is thinner than the second thickness in a state where the insulation film pattern is present;
    (e) conducting, after the step (d), an electric test to the semiconductor wafer in a state where the insulation film pattern is present;
    (f) bonding, after the step (e), the second main surface of the semiconductor wafer to a pressure sensitive adhesive sheet thereby holding the semiconductor wafer by way of the pressure sensitive adhesive sheet to a dicing frame in a state where the insulation film pattern is present; and
    (g) dividing, after the step (f), the semiconductor wafer into individual chips in a state where it is held to the dicing frame.

2. The manufacturing method according to claim 1, wherein the first insulation film has such a stress as relieving the stress exerting on the semiconductor wafer.

3. The manufacturing method according to claim 1, wherein the first insulation film is formed by CVD.

4. The manufacturing method according to claim 1, wherein the first insulation film is formed by plasma CVD.

5. The manufacturing method according to claim 1, wherein the first insulation film is formed by sputtering.

6. The manufacturing method according to claim 1, wherein the insulation film pattern shows an annular shape along the outer periphery of the semiconductor wafer.

7. The manufacturing method according to claim 1, wherein the first insulation film is an inorganic insulation film.

8. The manufacturing method according to claim 1, wherein, the first insulation film is a silicon nitride type insulation film.

9. The manufacturing method according to claim 1, wherein the first metal film is an aluminum type, copper type, or tungsten type metal film.

10. The manufacturing method according to claim 1, wherein the etching in the step (d) is wet etching.

11. The manufacturing method according to claim 1, wherein the insulation film pattern is formed by sputtering using a shadow mask.

12. The manufacturing method according to claim 1, wherein the electric test in the step (e) is a wafer test.

13. The manufacturing method according to claim 1, wherein the semiconductor device comprises a power MOSFET.

14. The manufacturing method according to claim 1, wherein the semiconductor device comprises an IGBT.

15. The manufacturing method according to claim 1, wherein the semiconductor wafer is a silicon type wafer.

16. The manufacturing method according to claim 1, further comprising a step of:

(h) before the step (e) and after the step (d), forming a second metal film over the second main surface of the semiconductor wafer in a state where the insulation film pattern is present.

17. The manufacturing method according to claim 16, further comprising a step of:

(i) before the step (h) and after the step (d), implanting impurity ions to the second main surface of the semiconductor wafer in a state where the insulation film pattern is present.

18. The manufacturing method according to claim 17, further comprising a step of:

(j) before the step (h) and after the step (i), conducting activation annealing for the impurity ions to the second main surface of the semiconductor wafer in a state where the insulation film pattern is present.

19. The manufacturing method according to claim 18, further comprising a step of:

(k) before the step (h) and after the step (j), removing an oxide film in the opening of the second main surface of the semiconductor wafer in a state where the insulation film pattern is present.

20. The manufacturing method according to claim 1, wherein the first thickness is 230 μm or more and less than 1 mm, the second thickness is 70 μm or more and less than 230 μm, and the third thickness is less than 200 μm and 30 μm or more.

* * * * *